United States Patent [19]

Feldtkeller

[11] Patent Number: 5,453,900
[45] Date of Patent: Sep. 26, 1995

[54] PROTECTIVE CIRCUIT FOR A POWER MOSFET THAT DRIVES AN INDUCTIVBE LOAD

[75] Inventor: Martin Feldtkeller, München, Germany

[73] Assignee: Siemens Aktiengesellschaft, Munich, Germany

[21] Appl. No.: 28,403

[22] Filed: Mar. 9, 1993

[30] Foreign Application Priority Data

Mar. 10, 1992 [DE] Germany .................. 42 07 590.4

[51] Int. Cl.$^6$ ........................................ H02H 7/10
[52] U.S. Cl. .................... 361/18; 361/91; 361/86
[58] Field of Search ................. 361/56, 111, 58, 361/18, 91, 86

[56] References Cited

FOREIGN PATENT DOCUMENTS

| 0072523 | 2/1983 | European Pat. Off. . |
|---|---|---|
| 0236158 | 9/1987 | European Pat. Off. . |
| 0380881 | 8/1990 | European Pat. Off. . |
| 0382906 | 8/1990 | European Pat. Off. . |

Primary Examiner—Todd Deboer
Attorney, Agent, or Firm—Herbert L. Lerner; Laurence A. Greenberg

[57] ABSTRACT

A protective circuit configuration for a power transistor having a load circuit and a control terminal includes an inductive load connected into the load circuit of the power transistor. A further transistor has a control terminal and has a load path connected between the load path and the control terminal of the power transistor. A control device is supplied by a voltage applied to the load path of the power transistor. The control device generates a control signal from the voltage applied to the load path of the power transistor for delivering the control signal to the control terminal of the further transistor.

4 Claims, 1 Drawing Sheet

PROTECTIVE CIRCUIT FOR A POWER MOSFET THAT DRIVES AN INDUCTIVBE LOAD

SPECIFICATION

The invention relates to a protective circuit for a power transistor having a load circuit into which an inductive load is connected, a transistor having a load path being connected between the load path and the control terminal of the power transistor, and a control device generating a control signal being delivered to the control terminal of the transistor.

Figure 1:
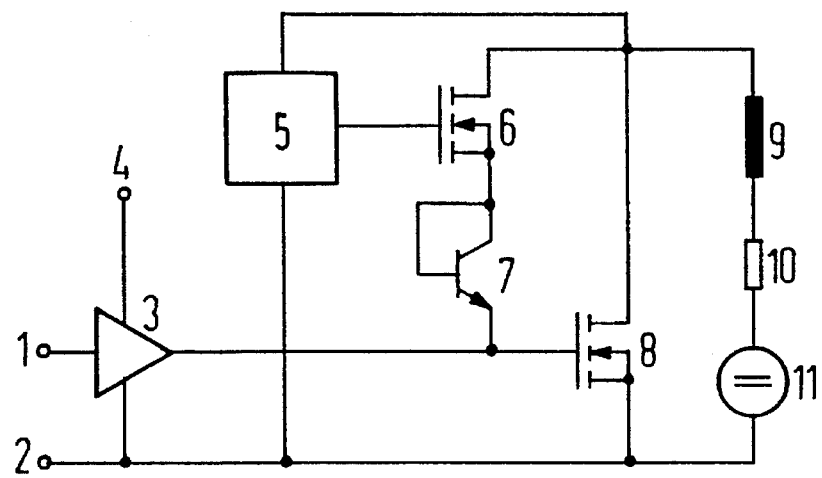

If electronic power switches are used to switch inductive loads, then the inductive energy released upon turnoff must be dissipated by the power switch. To that end, the load current must be capable of continuing to flow through the power switch, but the voltage drop at the power switch must be substantially greater than the supply voltage of the load circuit, so that the voltage can reverse direction at the load. Published European Application No. 0 380 881 A2, corresponding to U.S. Pat. No. 4,860,152, teaches that the gate and drain terminals of a power transistor, or the collector and base terminals in the case of bipolar transistors, must be connected to a series circuit including a corresponding number of Zener diodes and diodes polarized in the flow direction. Such a configuration is shown in FIG. 1 of Published European Application No. 0 380 881 A2, corresponding to U.S. Pat. No. 4,860,152, for instance. If the control voltage turns off the power transistor, then the drain voltage rises until current begins to flow through the Zener diode chain, which accordingly makes the transistor conducting again.

It is disadvantageous that such a so-called switchoff voltage and its temperature coefficient can be adjusted only in relatively coarse increments, which are dictated by technology. A further disadvantage is that the switchoff voltage and its temperature coefficient deviate widely depending on the technological parameters, and also that the crackling of the Zener diodes causes electromagnetic voltage (EMV) problems.

Figure 2:
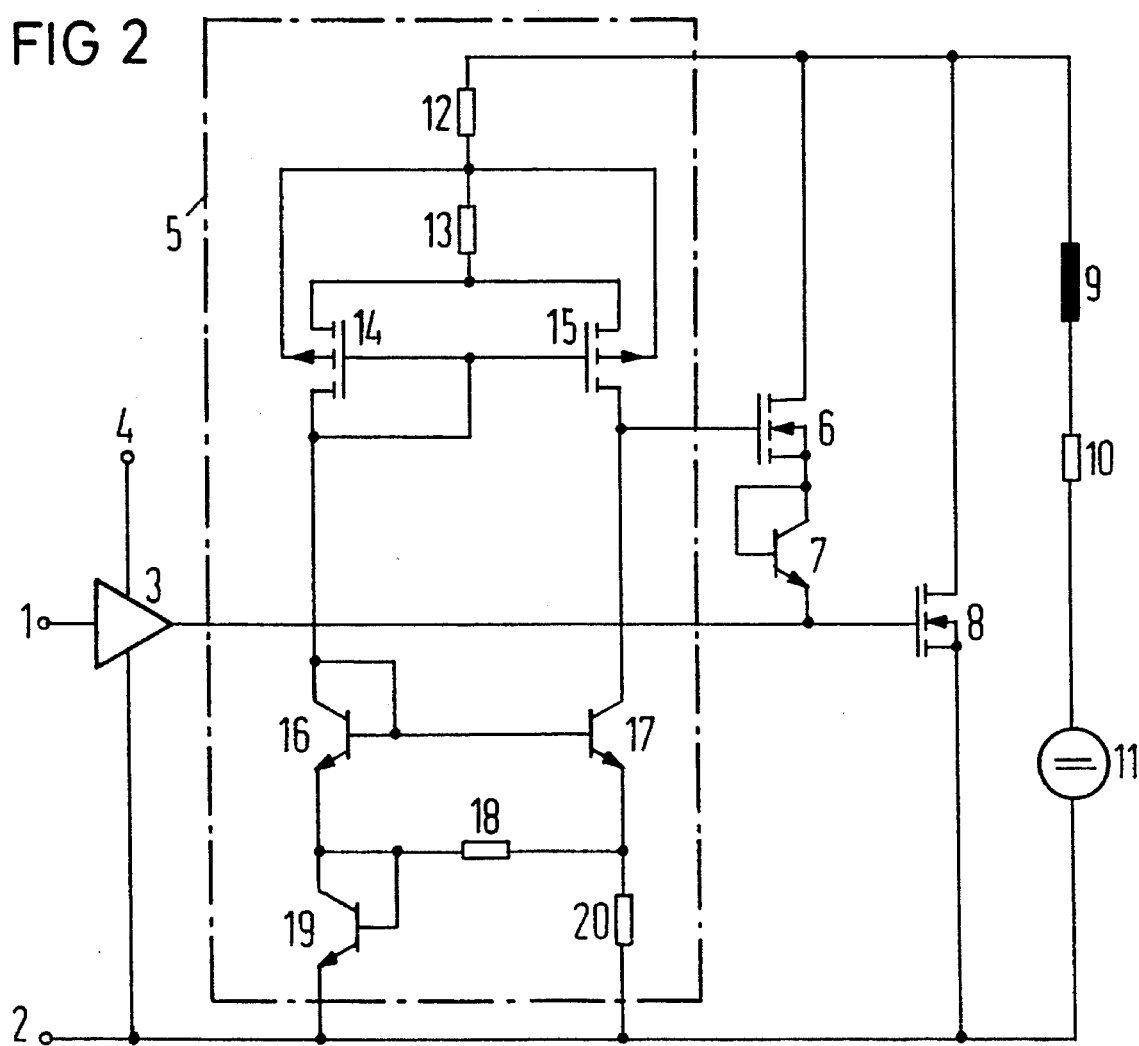

FIG. 2 of Published European Application No. 0 380 881 A2, corresponding to U.S. Pat. No. 4,860,152, shows a configuration that overcomes those disadvantages by comparing the output voltage being divided downward through a resistance divider, with an internally generated reference. The power transistor is then accordingly made conducting with the resultant signal. However, the disadvantage of that circuit configuration is that if the supply voltage fails it will not dissipate any inductive energy that is still present, and as a result the power transistor may possibly be destroyed.

It is accordingly an object of the invention to provide a protective circuit for a power MOSFET that drives an inductive load, which overcomes the hereinafore-mentioned disadvantages of the heretofore-known devices of this general type.

With the foregoing and other objects in view there is provided, in accordance with the invention, in a circuit having a power transistor with a load circuit and a control terminal, a protective circuit configuration for the power transistor, comprising an inductive load connected into the load circuit of the power transistor; a further transistor having a control terminal and having a load path connected between the load path and the control terminal of the power transistor; and a control device being supplied by a voltage applied to the load path of the power transistor, the control device generating a control signal from the voltage applied to the load path of the power transistor for delivering the control signal to the control terminal of the further transistor.

In accordance with another feature of the invention, there is provided a diode connected between the control terminal of the power transistor and the load path of the further transistor.

In accordance with a further feature of the invention, the control device includes first and second MOSFETs having gate terminals being connected to one another, source terminals being connected to one another, drain terminals and substrate terminals, the gate terminal of the first MOSFET being connected to the drain terminal of the first MOSFET; first and second resistors being connected in a series circuit between the load path of the power transistor and the source terminals of the first and second MOSFETs, the series circuit having a node point connected to the substrate terminals of the first and second MOSFETs; and a current mirror circuit having an input circuit connected to the drain terminal of the first MOSFET and an output circuit connected to the drain terminal of the second MOSFET, the control signal being picked up at the drain terminal of the second MOSFET.

In accordance with an added feature of the invention, the current mirror circuit has a transformation ratio decreasing as the current increases.

In accordance with a concomitant feature of the invention, the current mirror circuit includes first, second and third transistors having emitter, collector and base terminals; the collector and base terminals of the first transistor being connected together to form the input circuit; the emitter terminal of the first transistor being connected to the collector terminal and the base terminal of the second transistor; the emitter terminal of the second transistor being connected to the reference potential; the collector terminal of the third transistor being connected to the output circuit; the base terminal of the third transistor being connected to the base terminal of the first transistor; a first resistor being connected between the emitter terminal of the third transistor and the collector terminal of the second transistor; and a second resistor being connected between the emitter terminal of the third transistor and the reference potential.

The embodiment according to the invention essentially forms a parallel controller in which the power transistor is included in the control circuit. This parallel controller is advantageously independent of the supply voltage of the trigger circuit, and its activation is therefore dependent only on the voltage applied to the load path of the power transistor.

Other features which are considered as characteristic for the invention are set forth in the appended claims.

Although the invention is illustrated and described herein as embodied in a protective circuit for a power MOSFET that drives an inductive load, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

FIG. 1 is a schematic and block diagram of a basic protective circuit configuration according to the invention; and FIG. 2 is a schematic diagram of an exemplary embodiment of the protective circuit configuration according to the invention.

Referring now to the figures of the drawing in detail and first, particularly, to FIG. 1 thereof, there is seen a circuit configuration that has two input terminals 1, 2. The input terminal 1 is supplied with a control signal, and a reference potential is applied to the input terminal 2. The input terminal 1 is connected to an input of a trigger circuit 3. This trigger circuit 3 is also connected both to the reference potential applied to the input terminal 2 and to a supply voltage applied to a further input terminal 4. The trigger circuit 3 generates an output signal that is delivered to a gate or control terminal of a power MOSFET 8. A load path of the power MOSFET 8 is connected on one hand to the reference potential and on the other hand to a first terminal of an inductive resistor 9. A second terminal of the inductive resistor 9 is connected through an ohmic resistor 10 to a first terminal of a supply voltage source 11. The inductive load is composed of the inductive resistor 9 and the ohmic resistor 10. A second terminal of the supply voltage source 11 is connected to the reference potential. A series circuit including a load path of a further MOSFET 6 and a bipolar transistor 7 connected as a diode is connected between the drain terminal and the gate terminal of the power MOSFET 8. A control device or circuit 5 with two inputs and one output is also provided. A first input of the control device 5 is connected to the reference potential and a second input thereof is connected to the drain terminal of the power MOSFET 8. The output of the control device 5 is connected to the gate or control terminal of the MOSFET 6.

FIG. 2 largely agrees with FIG. 1, so that identical components have the same reference numerals. However, a detailed embodiment of the control circuit 5 is shown in FIG. 2. The control circuit 5 includes two series-connected resistors 12, 13. The series circuit of the resistors 12, 13 is connected on one hand to the drain terminal of the power MOSFET 8 and on the other hand to source terminals of two further MOSFETs 14, 15. Gate terminals of the MOSFETs 14 and 15 are connected to one another. The gate terminal of the MOSFET 14 is also connected to its drain terminal. Substrate terminals of the two MOSFETs 14 and 15 are connected to a node point of the series circuit of the two resistors 12 and 13. The drain terminal of the MOSFET 14 is connected to an input circuit of a current mirror configuration, and the drain terminal of the MOSFET 15 is connected to an output circuit of this current mirror configuration. The drain terminal of the MOSFET 15 is also connected to the gate terminal of the MOSFET 6.

The current mirror configuration includes three bipolar transistors 16, 17, 19 and two resistors 18, 20. The drain terminal of the MOSFET 14 is connected to a collector terminal and to a base terminal of the transistor 16. An emitter terminal of the transistor 16 is connected to the reference potential through a collector-to-emitter path of the transistor 19. A collector terminal and a base terminal of the transistor 19 are short-circuited and are also connected to a first terminal of the resistor 18. The base terminal of the transistor 16 is also connected to a base terminal of the transistor 17. An emitter terminal of the transistor 17 is connected to a second terminal of the resistor 18 and through the resistor 20 to the reference potential. Finally, a collector terminal of the transistor 17 is connected to the drain terminal of the MOSFET 15.

Similarly to the situation with a band gap reference, the emitter-to-base voltage of the transistor 19 and, if the current density differs, the difference between the two emitter-to-base voltages of the transistors 16 and 17, serve as the reference voltage for the control device 5. The current across the resistors 12 and 13, minus the threshold voltages of the transistors 16 and 19 and of the MOSFET 14, is proportional to the voltage on the load path of the power MOSFET 8 and is distributed to the two bipolar transistors 16 and 17 in accordance with the channel width ratio of the two MOSFETs 14 and 15.

The current mirror including the three transistors 16, 17 and 19 and the two resistors 18 and 20 has a transformation ratio that decreases as the current increases, so that for a certain output voltage, the drain current from the MOSFET 15 becomes higher than the collector current of the bipolar transistor 17, and the collector-to-emitter voltage of the transistor 17 rises. A rise in the gate voltage of the MOSFET 6 has the effect of raising the gate voltage of the power MOSFET 8 as well.

The transistor 7, which is connected as a diode, prevents the gate terminal from being discharged through the load path of the MOSFET 6 if the power MOSFET 8 is made conducting.

By way of the substrate control effect of the two MOSFETs 14 and 15, it is assured that the gate voltage of the MOSFET 6 can rise beyond the threshold voltage of the MOSFET 6 and the MOSFET 8 only whenever the current mirror 16 . . . 20 is adequately supplied with current and is operating in its functional range.

The protective circuit configuration disclosed herein is not limited to protective circuits for power MOSFETs, but rather it is equally applicable to bipolar power transistors.

I claim:

1. In a circuit having a power transistor with a load circuit and a control terminal, a protective circuit configuration for the power transistor, comprising:

an inductive load connected into the load circuit of the power transistor;

a further transistor having a control terminal and having a load path connected between the load circuit and the control terminal of the power transistor; and a control device being supplied by a voltage applied to the load path of the power transistor, said control device generating a control signal from the voltage applied to the load path of the power transistor for delivering the control signal to the control terminal of said further transistor;

said control device including:

first and second MOSFETs having gate terminals being connected to one another, source terminals being connected to one another, drain terminals and substrate terminals, the gate terminal of said first MOSFET being connected to the drain terminal of said first MOSFET;

first and second resistors being connected in a series circuit between the load path of the power transistor and the source terminals of said first and second MOSFETs, said series circuit having a node point connected to the substrate terminals of said first and second MOSFETs; and a current mirror circuit having an input circuit connected to the drain terminal of said first MOSFET and an output circuit connected to the drain terminal of said second MOSFET, the control signal being picked up at the drain terminal of said second MOSFET.

2. The protective circuit configuration according to claim 1, including a diode connected between the control terminal of the power transistor and the load path of the further transistor.

3. The protective circuit configuration according to claim 1, wherein said current mirror circuit has a transformation ratio decreasing as the current increases.

4. The protective circuit configuration according to claim 3, wherein said current mirror circuit includes:

first, second and third transistors having emitter, collector and base terminals;

the collector and base terminals of said first transistor being connected together to form the input circuit;

the emitter terminal of said first transistor being connected to the collector terminal and the base terminal of said second transistor;

the emitter terminal of said second transistor being connected to the reference potential;

the collector terminal of said third transistor being connected to the output circuit;

the base terminal of said third transistor being connected to the base terminal of said first transistor;

a first resistor being connected between the emitter terminal of said third transistor and the collector terminal of said second transistor; and a second resistor being connected between the emitter terminal of said third transistor and the reference potential.

* * * * *

UNITED STATES PATENT AND TRADEMARK OFFICE
CERTIFICATE OF CORRECTION

PATENT NO. : 5,453,900
DATED : September 26, 1995
INVENTOR(S) : Martin Feldtkeller It is certified that error appears in the above-indentified patent and that said Letters Patent is hereby corrected as shown below:

In the title, item (54), line 2,

"INDUCTIVBE"

should read

-- INDUCTIVE --.

Signed and Sealed this

Twenty-sixth Day of December, 1995

Attest:

BRUCE LEHMAN

Attesting Officer   Commissioner of Patents and Trademarks